US00RE50526E

(19) United States
(12) Reissued Patent
Yamane et al.

(10) Patent Number: US RE50,526 E
(45) Date of Reissued Patent: *Aug. 5, 2025

(54) METHOD FOR MANUFACTURING LIGHT EMITTING DEVICE, AND LIGHT EMITTING DEVICE

(71) Applicant: Samsung Display Co., Ltd., Yongin-si (KR)

(72) Inventors: Hiroaki Yamane, Osaka (JP); Gosuke Sakamoto, Kyoto (JP); Kenji Okumoto, Osaka (JP)

(73) Assignee: Samsung Display Co., Ltd., Yongin-si (KR)

( * ) Notice: This patent is subject to a terminal disclaimer.

(21) Appl. No.: 17/867,631

(22) Filed: Jul. 18, 2022

Related U.S. Patent Documents

Reissue of:
(64) Patent No.: 9,231,156
Issued: Jan. 5, 2016
Appl. No.: 14/049,336
Filed: Oct. 9, 2013

U.S. Applications:
(63) Continuation of application No. 16/867,874, filed on May 6, 2020, now Pat. No. Re. 49,168, which is a
(Continued)

(30) Foreign Application Priority Data

Sep. 26, 2011 (JP) ..... 2011-209364

(51) Int. Cl.
*H10D 86/01* (2025.01)
*G09F 9/30* (2006.01)
(Continued)

(52) U.S. Cl.
CPC ..... *H10D 86/021* (2025.01); *G09F 9/30* (2013.01); *H05B 33/12* (2013.01); *H05B 33/22* (2013.01);
(Continued)

(58) Field of Classification Search
None
See application file for complete search history.

(56) References Cited

U.S. PATENT DOCUMENTS 6,300,224 B1 10/2001 Arima et al.
7,888,867 B2 2/2011 Yoshida et al.
(Continued)

FOREIGN PATENT DOCUMENTS

CN 101065239 10/2007
CN 101065239 A 10/2007
(Continued)

OTHER PUBLICATIONS

International Search Report (ISR) in International Application No. PCT/JP2012/005604, dated Oct. 9, 2012.
(Continued)

*Primary Examiner* — Minh Nguyen
(74) *Attorney, Agent, or Firm* — Womble Bond Dickinson (US) LLP

(57) ABSTRACT

A method for manufacturing a light-emitting device, comprising: forming, over a substrate, a plurality of multilayered light-emitting structures each including a first electrode, a light-emitting layer, and a second electrode; forming, in the substrate, a plurality of grooves that surround the multilayered light-emitting structures individually; forming, over the substrate, a sealing film that covers the multilayered light-emitting structures and the grooves; and separating the multilayered light-emitting structures from one another after forming the sealing film, by cutting the substrate such that, in each groove, part of the sealing film covering a given inner side surface of the groove remains, the given inner side surface being adjacent to any of the multilayered light-emitting structures.

10 Claims, 12 Drawing Sheets

Related U.S. Application Data continuation of application No. 15/860,927, filed on Jan. 3, 2018, now Pat. No. Re. 48,033, which is an application for the reissue of Pat. No. 9,231,156, which is a continuation of application No. PCT/JP2012/005604, filed on Sep. 5, 2012.

(51) Int. Cl.

| | |
|---|---|
| ***H05B 33/12*** | (2006.01) |
| ***H05B 33/22*** | (2006.01) |
| ***H05B 33/26*** | (2006.01) |
| ***H10D 30/01*** | (2025.01) |
| ***H10D 30/67*** | (2025.01) |
| ***H10D 64/01*** | (2025.01) |
| ***H10D 86/40*** | (2025.01) |
| ***H10D 86/60*** | (2025.01) |
| ***H10D 99/00*** | (2025.01) |
| ***H10H 20/83*** | (2025.01) |
| ***H10K 50/844*** | (2023.01) |
| ***H10K 59/12*** | (2023.01) |
| ***H10K 59/121*** | (2023.01) |
| ***H10K 59/122*** | (2023.01) |
| ***H10K 59/80*** | (2023.01) |
| ***H10K 71/00*** | (2023.01) |

(52) U.S. Cl.

CPC ..... *H05B 33/26* (2013.01); *H10D 30/0314* (2025.01); *H10D 30/0321* (2025.01); *H10D 30/0323* (2025.01); *H10D 30/67* (2025.01); *H10D 30/6713* (2025.01); *H10D 30/6755* (2025.01); *H10D 64/021* (2025.01); *H10D 86/423* (2025.01); *H10D 86/60* (2025.01); *H10D 99/00* (2025.01); *H10H 20/83* (2025.01); *H10K 50/844* (2023.02); *H10K 59/122* (2023.02); *H10K 59/873* (2023.02); *H10K 71/00* (2023.02); *H10K 59/1201* (2023.02); *H10K 59/1213* (2023.02); *H10K 71/851* (2023.02)

(56) References Cited

U.S. PATENT DOCUMENTS

| | | | | |
|---|---|---|---|---|
| 7,964,416 | B2 | 6/2011 | Miyazawa | |
| 8,421,111 | B2 | 4/2013 | Matsuda et al. | |
| 2002/0070663 | A1 | 6/2002 | Ogura et al. | |
| 2002/0105265 | A1 | 8/2002 | Chuang | |
| 2003/0027369 | A1 | 2/2003 | Yamazaki | |
| 2003/0137325 | A1* | 7/2003 | Yamazaki | H10K 50/824 327/80 |
| 2004/0232832 | A1 | 11/2004 | Kubota | |
| 2004/0245541 | A1 | 12/2004 | Shitagaki et al. | |
| 2005/0088088 | A1 | 4/2005 | Yamazaki | |
| 2006/0220551 | A1 | 10/2006 | Yamazaki | |
| 2008/0000388 | A1 | 1/2008 | Abe | |
| 2008/0220151 | A1 | 9/2008 | Kataoka | |
| 2009/0021678 | A1 | 1/2009 | Son et al. | |
| 2009/0261720 | A1* | 10/2009 | Shinto | H10K 59/131 313/504 |
| 2010/0213828 | A1 | 8/2010 | Seo et al. | |
| 2011/0052836 | A1 | 3/2011 | Kim et al. | |
| 2011/0061904 | A1 | 3/2011 | Kim et al. | |
| 2011/0140164 | A1 | 6/2011 | Seo et al. | |
| 2011/0215292 | A1* | 9/2011 | Zaima et al. | 257/13 |

FOREIGN PATENT DOCUMENTS

| | | | |
|---|---|---|---|
| CN | 101351738 | | 1/2009 |
| CN | 101351738 | A | 1/2009 |
| JP | 2001-044141 | | 2/2001 |
| JP | 2001-044141 | A | 2/2001 |
| JP | 2003-332042 | | 11/2003 |
| JP | 2003-332042 | A | 11/2003 |
| JP | 2004-077717 | | 3/2004 |
| JP | 2004-077717 | A | 3/2004 |
| JP | 3761843 | | 3/2006 |
| JP | 3761843 | B2 | 3/2006 |
| JP | 2008-218323 | | 9/2008 |
| JP | 2008-218323 | A | 9/2008 |
| JP | 2010-199064 | | 9/2010 |
| JP | 2010-199064 | A | 9/2010 |
| JP | 2011-048374 | | 3/2011 |
| JP | 2011-048374 | A | 3/2011 |
| JP | 2011-065125 | | 3/2011 |
| JP | 2011-065125 | A | 3/2011 |
| JP | 2011-079219 | A | 4/2011 |
| JP | 2011-124228 | A | 6/2011 |

OTHER PUBLICATIONS

Office Action issued in China Counterpart Patent Appl. No. 201280019878.9, dated Jul. 22, 2015 , along with a partial English translation thereof.

* cited by examiner

METHOD FOR MANUFACTURING LIGHT EMITTING DEVICE, AND LIGHT EMITTING DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATION

[This U.S. patent application Ser. No. 14/049,336, which issued as U.S. Pat. No. 9,231,156 B2, is a continuation application of PCT Application No. PCT/JP2012/005604filed Sep. 5, 2012, designating the United States of America, the disclosure of which, including the specification, drawings and claims, is incorporated herein by reference in its entirety. Reissue application Ser. No. 15/860,927 is a reissue of U.S. Pat. No. 9,231,156B2.]

*This is a continuation reissue of U.S. patent application Ser. No. 16/867,874, filed on May 6, 2020, and is an application for reissue of U.S. Pat. No. 9,231,156, issued on Jan. 5, 2016. U.S. patent application Ser. No. 16/867,874 is a continuation reissue of U.S. patent application Ser. No. 15/860,927, filed on Jan. 3, 2018, now RE48033, which is an application for reissue of U.S. Pat. No. 9,231,156. U.S. Pat. No. 9,231,156 is a continuation of PCT/JP2012/005604, filed on Sep. 5, 2012, which claims priority to and the benefit of Japan Patent Application No. 2011-209364, filed on Sep. 26, 2011, the entire contents of all of which are herein incorporated by reference.*

TECHNICAL FIELD

The present disclosure relates to a method for manufacturing a light-emitting device such as an organic EL (Electro Luminescence) device, and in particular to the improvement of a sealing technology for preventing the degradation of a light-emitting device caused by moisture and oxygen.

DESCRIPTION OF THE RELATED ART

In recent years, development has been carried out on a technology for applying organic EL devices to displays and lighting apparatuses. An organic EL device includes a substrate and a multilayered light-emitting structure. The multilayered light-emitting structure includes an anode, a light-emitting layer, and a cathode which are layered over the substrate. When voltage is applied between the anode and the cathode, electric current flows through the light-emitting layer to emit light. In general, such a multilayered light-emitting structure includes a layer formed with a material that is easily degraded by moisture and oxygen. Accordingly, in the organic EL device, it is common to use a sealing film to cover the multilayered light-emitting structure formed on the substrate in order to prevent intrusion of moisture and oxygen from external environment.

According to Patent Literature 1, a substrate protection film made of alumina is formed on a resin substrate. Then, an organic EL structure is formed on the substrate protection film, and a device protection film made of alumina is formed on the organic EL structure (paragraphs 0044-0059). Patent Literature 1 recites that formation of these protection films can prevent degradation of the organic EL structure (paragraphs 0064-0067).

According to Patent Literature 2, a plastic film is formed into a bag, and a sealing film having gas barrier properties is formed inside the bag-shaped plastic film. Then, an organic EL panel is inserted in the bag-shaped plastic film. In this state, the bag-shaped plastic film is vacuum-compressed (paragraphs 0025-0032). Patent Literature 2 recites that the above structure can prevent degradation of the organic EL panel (paragraph 0038).

CITATION LIST

Patent Literature

Patent Literature 1

Japanese Patent Application Publication No. 2003-332042

Patent Literature 2

Japanese Patent No. 3761843

SUMMARY

Conventionally, a multiple production method is often employed in manufacturing an organic EL device or any other device including a substrate on which a multi-layered element is formed. According to the multiple production method, after a plurality of elements are simultaneously formed on a large substrate, the substrate is cut so as to separate the plurality of elements from one another. Suppose that the multiple production method is employed to manufacture an organic EL device. In this case, a plurality of multilayered light-emitting structures are formed on a large substrate. Then, a sealing film is formed to entirely cover the multilayered light-emitting structures. The substrate over which the sealing film is formed is then cut so as to separate the multilayered light-emitting structures from one another. With the multiple production method, the multilayered light-emitting structures are formed with use of the large substrate which is easily handled during the manufacturing of the organic EL device. This improves the productivity of organic EL devices.

On the other hand, if the substrate is cut without any measures being taken, the interface between the substrate and the sealing film will be exposed at a cut surface of the substrate. As a result, moisture and oxygen can easily infiltrate from the interface. In particular, during cutting of the substrate, stress is applied to the substrate and the sealing film. As a result, the sealing film is likely to peel off at the interface between the substrate and the sealing film, creating an infiltration path of moisture and oxygen. On the other hand, it is possible to form the sealing film after cutting the substrate into multiple substrates. In this way, the cutting surface of each separate substrate obtained as a result of the cutting is covered with the sealing film. However, this method causes the lowering of productivity since the substrates obtained as a result of the cutting are individually handled during the forming of the sealing film.

In view of the above problem, one non-limiting and exemplary embodiment provides a technology for manufacturing a light-emitting device resistant to the infiltration of moisture and oxygen, without causing the lowering of productivity.

In one general aspect, the techniques disclosed here feature a method for manufacturing a light-emitting device, comprising: forming, over a substrate, a plurality of multilayered light-emitting structures each including a first electrode, a light-emitting layer, and a second electrode; forming, in the substrate, a plurality of grooves that surround the multilayered light-emitting structures individually; forming, over the substrate, a sealing film that covers the multilayered light-emitting structures and the grooves; and separating the multilayered light-emitting structures from one another after forming the sealing film, by cutting the substrate such that, in each groove, part of the sealing film covering a given inner side surface of the groove remains, the given inner side surface being adjacent to any of the multilayered light-emitting structures.

The given inner side surface of each groove serves as part of the outer side surface of each separate substrate obtained as a result of the cutting. In the above method for manufacturing a light-emitting device, the substrate is cut into multiple substrates such that, in each groove, part of the sealing film covering the given inner side surface of the groove remains. As a result, part of the outer side surface of each separate substrate is covered by the sealing film. This prevents the exposure of the interface between the sealing film and the top surface of each separate substrate obtained as a result of the cutting, allowing for the manufacture of a light-emitting device resistant to the infiltration of moisture and oxygen. Also, according to the above method for manufacturing a light-emitting device, the sealing film is formed before the substrate is cut. Therefore, productivity is not lowered during forming of the sealing film. This allows for manufacturing of a light-emitting device resistant to the infiltration of moisture and oxygen, without causing the lowering of productivity.

These general and specific aspects may be implemented using a device.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIG. 1A is an overall view, FIG. 1B is a magnified view of a portion A, and FIG. 1C is a magnified view of a portion B.

DETAILED DESCRIPTION

Figure 1A:
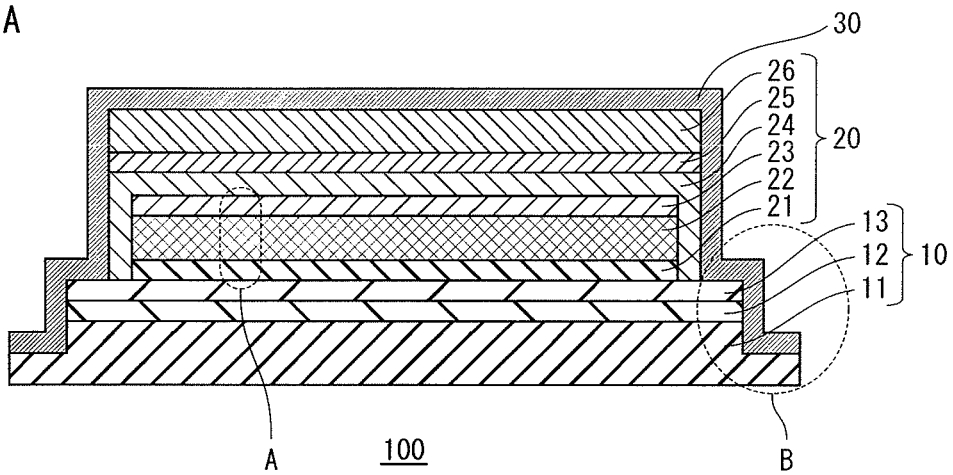
FIGS. 1A to 1C are cross-sectional views each showing the structure of a light-emitting device according to an embodiment of the present disclosure, where

[Outline of an Aspect of the Present Disclosure]

One aspect of the present disclosure is a method for manufacturing a light-emitting device, comprising: forming, over a substrate, a plurality of multilayered light-emitting structures each including a first electrode, a light-emitting layer, and a second electrode; forming, in the substrate, a plurality of grooves that surround the multilayered light-emitting structures individually; forming, over the substrate, a sealing film that covers the multilayered light-emitting structures and the grooves; and separating the multilayered light-emitting structures from one another after foaming the sealing film, by cutting the substrate such that, in each groove, part of the sealing film covering a given inner side surface of the groove remains, the given inner side surface being adjacent to any of the multilayered light-emitting structures.

The given inner side surface of each groove serves as part of the outer side surface of each separate substrate obtained as a result of the cutting. In the above method for manufacturing a light-emitting device, the substrate is cut into multiple substrates such that, in each groove, part of the sealing film covering the given inner side surface of the groove remains. As a result, part of the outer side surface of each separate substrate obtained as a result of the cutting is covered by the sealing film. This prevents the exposure of the interface between the sealing film and the top surface of each separate substrate obtained as a result of the cutting, allowing for the manufacture of a light-emitting device resistant to the infiltration of moisture and oxygen. Also, according to the above method for manufacturing a light-emitting device, the sealing film is formed before the substrate is cut. Therefore, productivity is not lowered during forming of the sealing film. This allows for manufacturing of a light-emitting device resistant to the infiltration of moisture and oxygen, without causing the lowering of productivity.

When separating the multilayered light-emitting structures, the substrate may be cut along each groove at a position closer to a center of the groove in a width direction thereof than to the given inner side surface of the groove, so that the part of the sealing film covering the given inner side surface remains.

Also, when separating the multilayered light-emitting structures, the substrate may be cut with a cutting width smaller than a width of each groove.

Furthermore, the substrate may include a resin film, a gas barrier layer, and an underlayer. The gas barrier layer may be formed over the resin film. The underlayer may be formed over the gas barrier layer, and the multilayered light-emitting structures may be formed over the underlayer. When forming the grooves, a depth of each groove may be adjusted such that a bottom surface of each groove reaches at least the gas barrier layer.

Also, the sealing film may be formed by atomic layer deposition.

One aspect of the present disclosure is a light-emitting device, comprising: a substrate having a top surface and an outer side surface; a multilayered light-emitting structure formed over the top surface of the substrate and including a first electrode, a light-emitting layer, and a second electrode; and a sealing film covering the multilayered light-emitting structure, wherein the substrate has an extended portion extending outwards from the outer side surface of the substrate, and the sealing film extends along the outer side surface of the substrate to cover a top surface of the extended portion.

One aspect of the present disclosure is a method for manufacturing a light-emitting device, comprising: forming, over a substrate, a plurality of multilayered light-emitting structures each including a first electrode, a light-emitting layer, and a second electrode; forming, in the substrate, a plurality of grooves that surround the multilayered light-emitting structures individually; forming, over the substrate, a sealing film that covers the multilayered light-emitting structures and the grooves; and separating the multilayered light-emitting structures from one another after forming the sealing film, by cutting the substrate into individual substrate pieces along each groove, wherein the substrate includes a gas barrier layer that opposes the sealing film via the multilayered light-emitting structures, when forming the grooves, a depth of each groove is adjusted such that a bottom surface of the groove reaches at least the gas barrier layer, a given inner side surface of each groove, which is adjacent to any of the multilayered light-emitting structures, serves as part of an outer side surface of each individual substrate piece after the multilayered light-emitting structures are separated, and the part of the outer side surface of each individual substrate piece is covered with part of the sealing film.

One aspect of the present disclosure is a method for manufacturing a light-emitting device, comprising: preparing a substrate having a plurality of grooves that surround a plurality of regions individually; forming, in each region of the substrate, a multilayered light-emitting structure including a first electrode, a light-emitting layer, and a second electrode; forming, over the substrate, a sealing film that covers the multilayered light-emitting structures and the grooves; and separating the multilayered light-emitting structures from one another after forming the sealing film, by cutting the substrate into individual substrate pieces along each groove, wherein the substrate includes a gas barrier layer that opposes the sealing film via the multilayered light-emitting structures, a depth of each groove in the substrate has been adjusted such that a bottom surface of the groove reaches at least the gas barrier layer, a given inner side surface of each groove, which is adjacent to any of the multilayered light-emitting structures, serves as part of an outer side surface of each individual substrate piece after the multilayered light-emitting structures are separated, and the part of the outer side surface of each individual substrate piece is covered with part of the sealing film.

[Structure of Light-Emitting Device]

An embodiment of the present disclosure is described in detail with reference to the drawings.

Figure 1B:
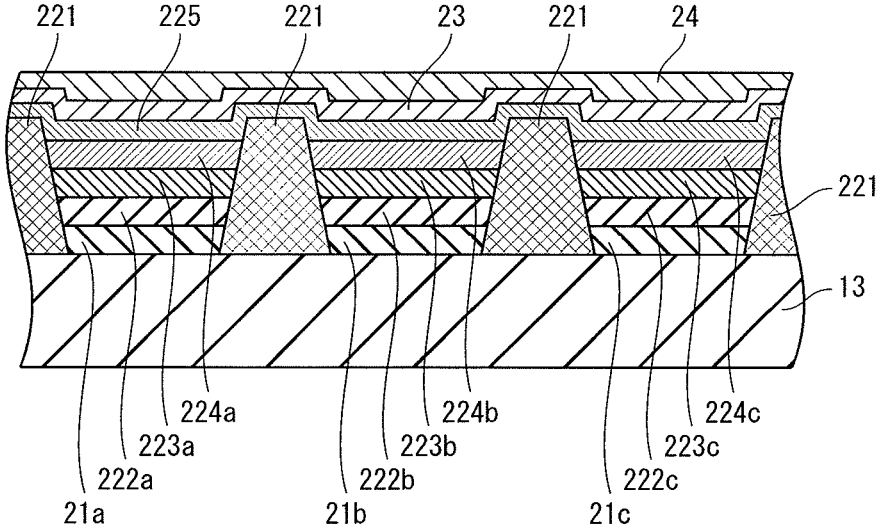
Figure 1C:
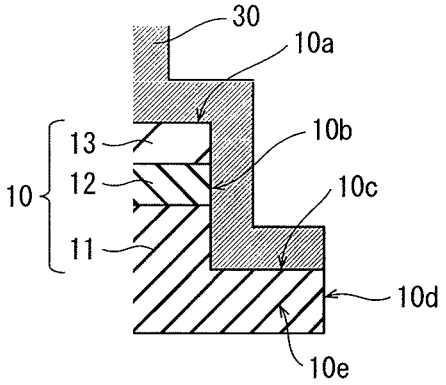

FIGS. 1A to 1C are cross-sectional views each showing the structure of a light-emitting device according to an embodiment of the present disclosure. Specifically, FIG. 1A is an overall view, FIG. 1B is a magnified view of a portion A, and FIG. 1C is a magnified view of a portion B.

A light-emitting device 100 is a top emission type organic EL display. The light-emitting device 100 includes: a substrate 10; a multilayered light-emitting structure 20 formed on the substrate 10; and a sealing film 30 that seals the multilayered light-emitting structure 20.

The substrate 10 includes a resin film 11, a gas barrier layer 12, and a TFT (Thin Film Transistor) layer 13. For example, the resin film 11 is made of resin such as polyimide. The gas barrier layer 12 is formed on the resin film 11. For example, the gas barrier layer 12 is made of a material having gas barrier properties such as silicon nitride. The TFT layer 13 is formed on the gas barrier layer 12. The TFT layer 13 has drive circuits provided for respective pixels.

The multilayered light-emitting structure 20 includes an anode layer 21, a light-emitting layer 22, a cathode layer 23, a sealing layer 24, a resin layer 25, and a resin film 26. The anode layer 21 is made of a conductive light-reflective material. Examples of such a material include aluminum and aluminum alloy. The light-emitting layer 22 is provided between the anode layer 21 and the cathode layer 23. When voltage is applied between the anode layer 21 and the cathode layer 23, electric current flows through the light-emitting layer 22, whereby the light-emitting layer 22 emits light. FIG. 1B is a magnified view of the portion A, and shows three pixels. The light-emitting layer 22 at least includes an organic EL layer. The light-emitting layer 22 may further include various functional layers as necessary, such as a hole injection layer, a hole transport layer, an electron injection layer, and an electron transport layer. In the present embodiment, the light-emitting layer 22 includes hole injection layers 222a, 222b, and 222c, hole transport layers 223a, 223b, and 223c, organic EL layers 224a, 224b, and 224c, and an electron transport layer 225. Some or all the layers included in the light-emitting layer 22 are sectioned by banks on a pixel-by-pixel basis as necessary. In the present embodiment, the following layers are sectioned by banks 221: the hole injection layers 222a, 222b, and 222c; the hole transport layers 223a, 223b, and 223c; and the organic EL layers 224a, 224b, and 224c. The cathode layer 23 is made of a conductive light-transmissive material. Examples of such a material include ITO (Indium Tin Oxide) or IZO (Indium Zinc Oxide). The sealing layer 24 covers a multilayered structure consisting of the anode layer 21, the light-emitting layer 22, and the cathode layer 23. The sealing layer 24 is made of a material having gas barrier properties such as silicon nitride. The resin layer 25 is formed on the sealing layer 24, and is made of epoxy resin, for example. For example, the resin film 26 is made of resin such as polyimide, polyethylene terephthalate (PET), polyethylene naphthalate (PEN), or cycloolefin polymer (COP), and has flexibility and insulation properties.

For example, the sealing film 30 is made of a material having gas barrier properties, such as alumina ($Al_2O_3$) or silicon nitride. The sealing film 30 covers the multilayered light-emitting structure 20, and extends to the outer side surface of the substrate 10 to cover part of the outer side surface. FIG. 1C is a magnified view of the portion B. The substrate 10 has an extended portion 10e, which extends outwards from the outer side surface of the substrate 10 and surrounds the entire periphery of the substrate 10. The sealing film 30 extends from a top surface 10a of the substrate 10 along an outer side surface 10b to a top surface 10c of the extended portion 10e. Note that an outer side surface 10d of the extended portion 10e is not covered by the sealing film 30. The above structure can lengthen the infiltration path of moisture and oxygen which continues from the outer side surface 10d at which the interface between the substrate 10 and the sealing film 30 is exposed to the multilayered light-emitting structure 20. As a result, sealing properties are improved. Also, suppose that the multiple production method is employed to manufacture the light-emitting device 100. In this case, during cutting of the substrate, mechanical or thermal stress is applied to a cut surface of the substrate. As a result, peeling of the sealing film 30 may progress for a certain distance from the cut surface. In the present embodiment, the distance from the cut surface to the multilayered light-emitting structure 20 is lengthened. As a result, peeling of the sealing film 30 does not easily progress to the multilayered light-emitting structure 20.

[Method for Manufacturing Light-Emitting Device]

The following describes a method for manufacturing a light-emitting device with reference to FIGS. 2A-2B, FIG. 3, and FIGS. 4A-4C. This method employs the aforementioned multiple production method.

Figure 2A:
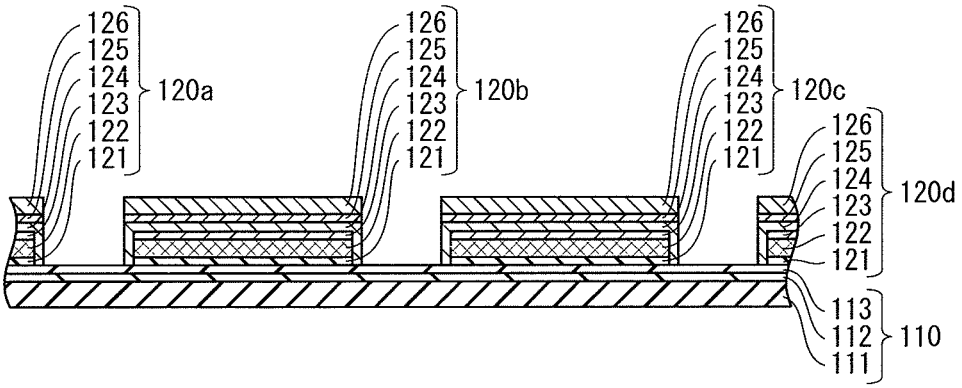
FIGS. 2A and 2B are cross-sectional views illustrating a manufacturing process of the light-emitting device according to the embodiment of the present disclosure.

First, a large substrate 110 is prepared, and multilayered light-emitting structures 120a, 120b, 120c, 120d, . . . are formed on the substrate 110 (FIG. 2A). The substrate 110 includes a resin film 111, a gas barrier layer 112, and a TFT layer 113. Needless to say, the substrate 110 is large enough for the formation of the multilayered light-emitting structures. Each of the multilayered light-emitting structures includes an anode layer 121, a light-emitting layer 122, a cathode layer 123, a sealing layer 124, a resin layer 125, and a resin film 126. Each of these layers can be formed with use of a well-known technique.

Figure 2B:
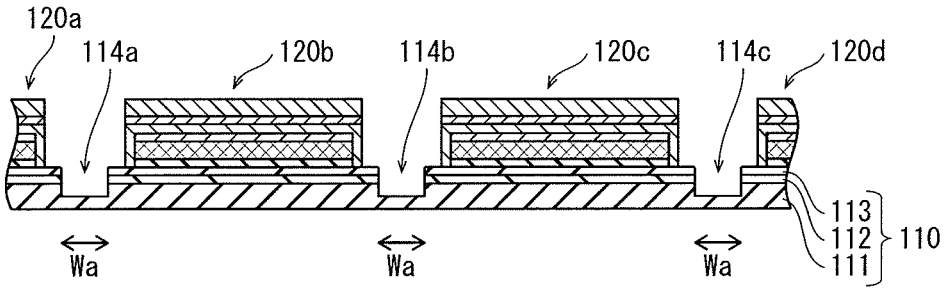
Figure 3:
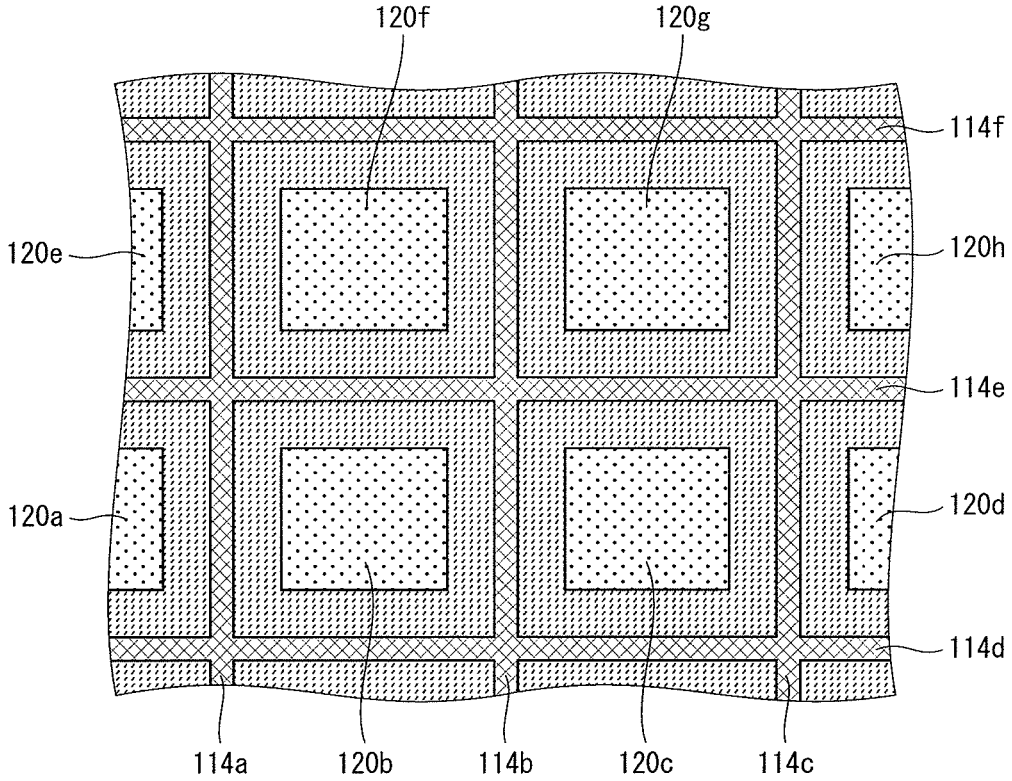
FIG. 3 is a plan view illustrating the manufacturing process of the light-emitting device according to the embodiment of the present disclosure.

Next, on the substrate 110, grooves 114a, 114b, 114c, 114d, 114e, 114f, . . . are formed to individually surround the multilayered light-emitting structures 120a, 120b, 120c, 120d, . . . (FIG. 2B and FIG. 3). FIG. 3 is a plan view showing the substrate 110 in which the grooves have been formed. As shown in FIG. 3, the multilayered light-emitting structure 120b is surrounded by four grooves, i.e., the grooves 114a and 114b extending longitudinally, and the grooves 114d and 114e extending laterally. The multilayered light-emitting structure 120c, located next to the multilayered light-emitting structure 120b, is also surrounded by four grooves, i.e., the grooves 114b and 114c extending longitudinally, and the grooves 114d and 114e extending laterally. As described above, each of the multilayered light-emitting structures is surrounded by four grooves. Also, as shown in FIG. 2B, the depth of each groove is set such that the depth is substantially constant across the entirety of the groove, and that the bottom surface of the groove reaches the resin film 111 but does not pass through the substrate 110. For example, the width of each groove is from several μm to several mm. For example, the grooves may be formed through a physical process such as a process using a blade or a laser. Alternatively, the grooves may be formed through a chemical process such as etching.

Figure 4A:
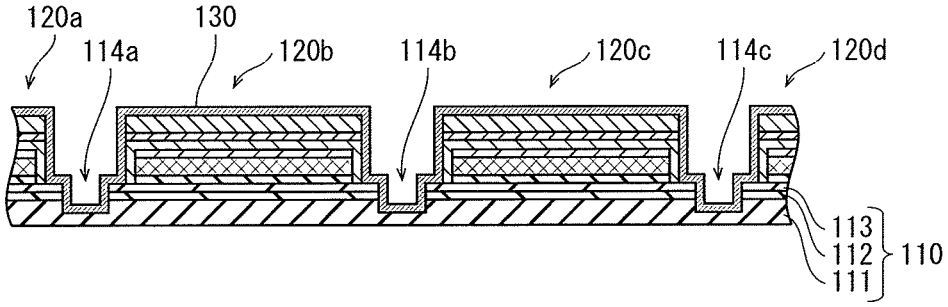
FIGS. 4A to 4C are cross-sectional views illustrating the manufacturing process of the light-emitting device according to the embodiment of the present disclosure.

Next, a sealing film 130 is formed entirely over the substrate 110 (FIG. 4A). In this way, the multilayered light-emitting structures 120a, 120b, 120c, 120d, . . . and the grooves 114a, 114b, 114c, 114d, 114e, 114f, . . . which respectively surround the multilayered light-emitting structures 120a, 120b, 120c, 120d, . . . are covered by the sealing film 130. For example, the thickness of the sealing film is from several nm to 100 nm. At each groove, the sealing film 130 is formed continuously from the top surface of the substrate 110, along an inner side surface of the groove, to the bottom surface of the groove. The sealing film 130 may be formed as described above by, for example, ALD (Atomic Layer Deposition) method, CVD (Chemical Vapor Deposition) method, or an application method. In particular, the ALD method is known as a film formation method with excellent step coverage, and is thus suitable for improvement of sealing properties.

Figure 4B:
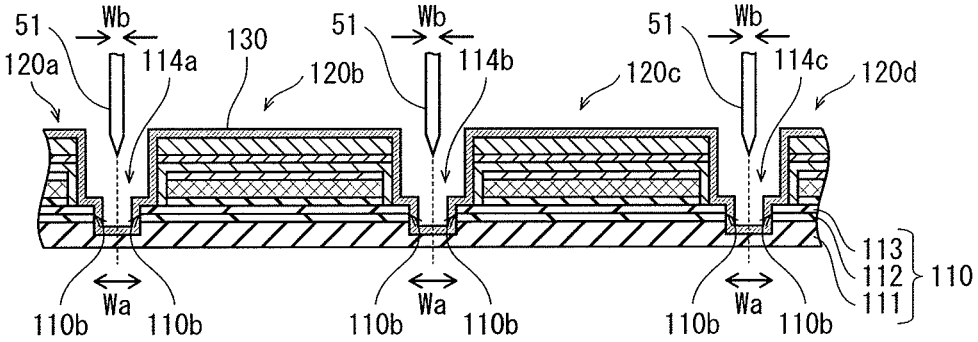
Figure 4C:
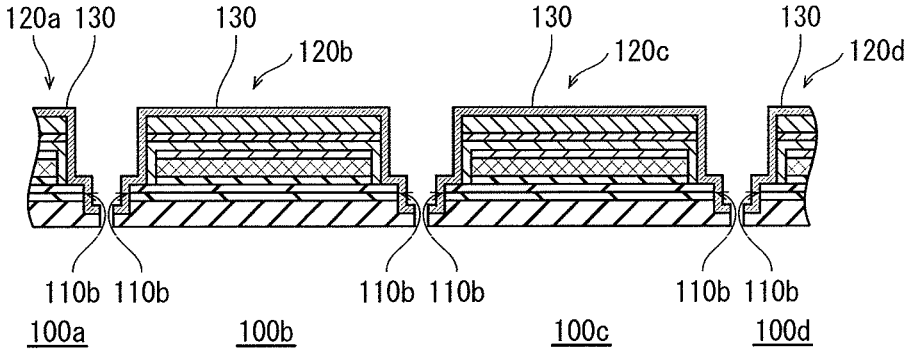

Next, cutters 51, each having a width Wb smaller than a width Wa of each groove, are prepared (FIG. 4B). With use of the cutters 51, the substrate 110 is cut along each groove at a position substantially at the center of the groove (FIG. 4C). As a result, the substrate 110 is cut so as to separate light-emitting devices 100a, 100b, 100c, 100d, . . . from one another. With this cutting method, parts of the sealing film 130 that cover inner side surfaces 110b of the respective grooves remain. The inner side surfaces 110b are adjacent to the multilayered light-emitting structures.

The inner side surfaces 110b of the grooves formed in the substrate 110 serve as parts of the outer side surfaces of each separate substrate obtained as a result of the cutting. In the above method for manufacturing a light-emitting device, the substrate 110 is cut into multiple substrates such that, in each groove, part of the sealing film 130 covering the inner side surface 110b of the groove remains. As a result, part of the outer side surface of each separate substrate is covered by the sealing film 130. This prevents the exposure of the interface between the sealing film 130 and the top surface of each separate substrate obtained as a result of the cutting, allowing for manufacturing of a light-emitting device resistant to the infiltration of moisture and oxygen.

Also, according to the above method for manufacturing a light-emitting device, the sealing film 130 is formed before the substrate 110 is cut. Therefore, productivity is not lowered during the step of forming the sealing film 130. This allows for manufacturing of a light-emitting device resistant to the infiltration of moisture and oxygen, without causing the lowering of productivity.

Also, there may be a case where, during cutting of the substrate 110 with use of the cutters 51, mechanical or thermal stress is applied to the cut surfaces of the substrate. As a result, peeling of the sealing film 30 may progress for a certain distance from each of the cut surfaces. However, according to the above method for manufacturing a light-emitting device, the distance from each of the cut surfaces to the corresponding multilayered light-emitting structure is lengthened. As a result, peeling of the sealing film 130 does not easily progress to the multilayered light-emitting structures.

[Modifications]

(1) Modifications Pertaining to Formation of Sealing Film in Grooves

Figure 5A:
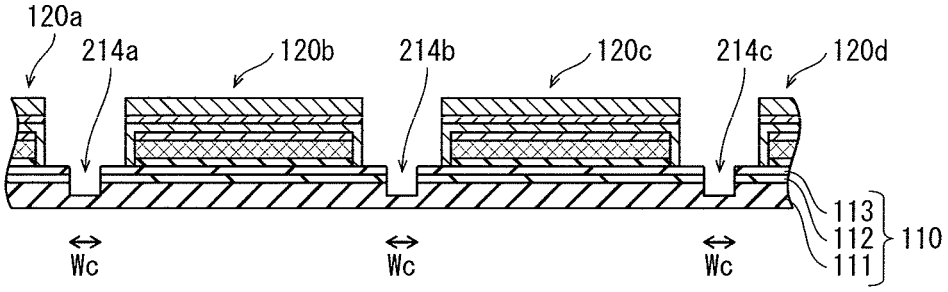
FIGS. 5A to 5D illustrate a modification pertaining to the formation of a sealing film in grooves.
Figure 5B:
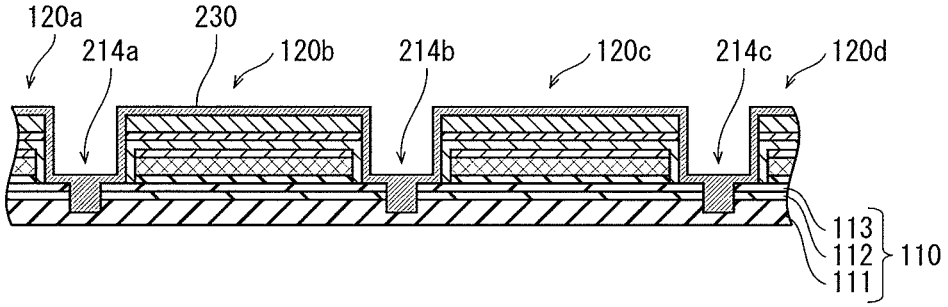
Figure 5C:
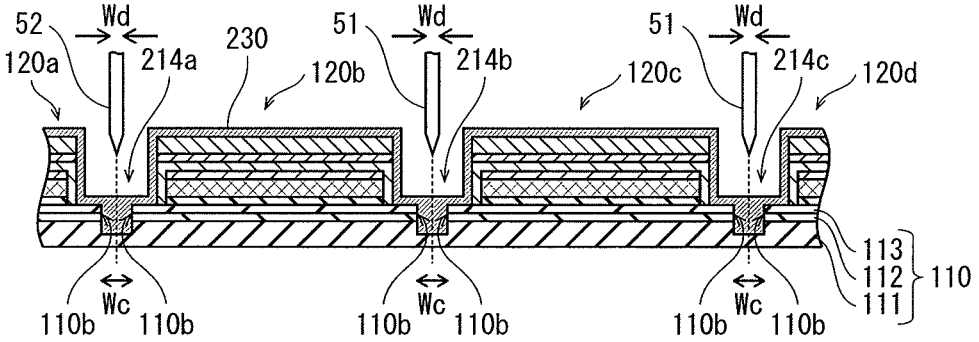

According to the above embodiment, the sealing film is a thin film formed along the inner side surfaces and the bottom surface of each groove. However, it is not limited to such, and there may be a case where the sealing film fills each groove as shown in FIGS. 5B and 5C.

Figure 5D:
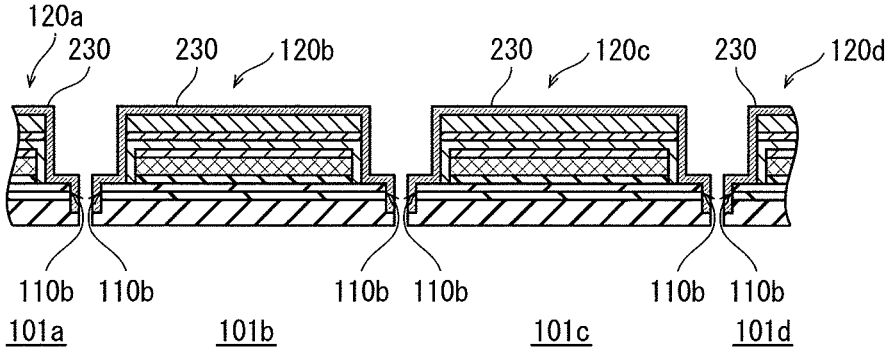

First, the multilayered light-emitting structures 120a, 120b, 120c, 120d, . . . are formed on the substrate 110, and grooves 214a, 214b, 214c, . . . are formed to individually surround the multilayered light-emitting structures 120a, 120b, 120c, 120d, . . . (FIG. 5A). Next, a sealing film 230 is formed entirely over the substrate 110 (FIG. 5B). At this time, the sealing film 230 is formed to fill inside the grooves 214a, 214b, 214c, . . . . This may be caused, for example, when the width of each groove is relatively small, or when the sealing film is formed by an application method. Finally, cutters 52, each having a width Wd smaller than a width Wc of each groove, are prepared (FIG. 5C). With use of the cutters 52, the substrate 110 is cut along each groove at a position substantially at the center of the groove (FIG. 5D). As a result, the substrate 110 is cut so as to separate the light-emitting devices 101a, 101b, 101c, 101d, . . . from one another. In this way, even when the sealing film 230 fills the grooves, the substrate 110 is cut into multiple substrates such that, in each groove, part of the sealing film 230 covering an inner side surface of the groove remains, the inner side surface being adjacent to any of the multilayered light-emitting structures.

(2) Modification Pertaining to Region Covered by Sealing Film

Figure 6A:
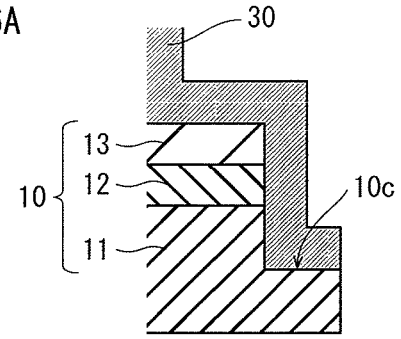
FIGS. 6A to 6D illustrate modifications pertaining to a region covered by the sealing film.
Figure 6B:
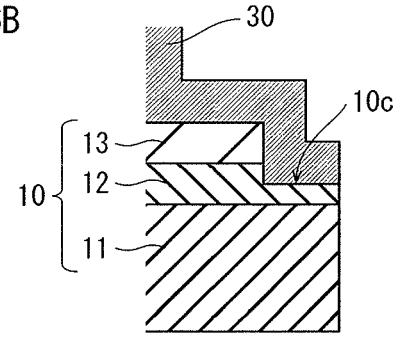

According to the above embodiment, as shown in FIG. 6A, the sealing film 30 covers the entirety of a side surface of the gas barrier layer 12. However, it is not limited to such as long as the sealing film 30 reaches a layer having gas barrier properties. For example, as shown in FIG. 6B, the top surface 10c of the extended portion is positioned at the gas barrier layer 12, and the sealing film 30 reaches the gas barrier layer 12. Even in such a case, the sealing film 30 is in close contact with the gas barrier layer 12, thus improving sealing properties.

Figure 6C:
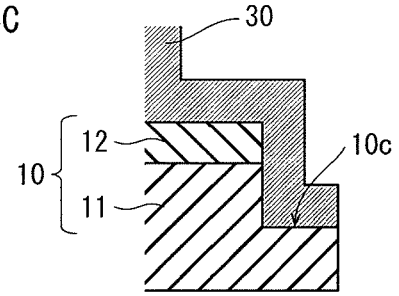
Figure 6D:
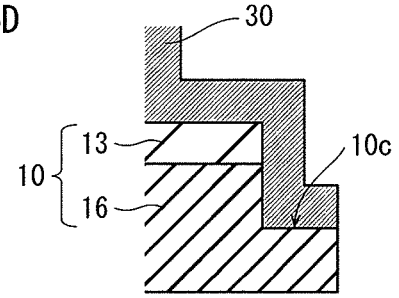

Also, in a case where the light-emitting device is a lighting device or a passive-matrix display, a TFT layer is not necessary. In such a case, the structure will be as shown in FIG. 6C. Also, in a case where a glass substrate is employed instead of a resin film, a gas barrier layer is not necessary since the glass substrate itself has gas barrier properties. In such a case, the structure will be as shown in FIG. 6D. In FIG. 6D, the substrate 10 is made up of a glass substrate 16 and a TFT layer 13, and the sealing film 30 reaches the glass substrate 16. In order for the sealing film to reach a layer having gas barrier properties, it would suffice for the bottom surface of each groove to reach the layer having gas barrier properties.

(3) Modifications Pertaining to Layout of Grooves

Figure 7A:
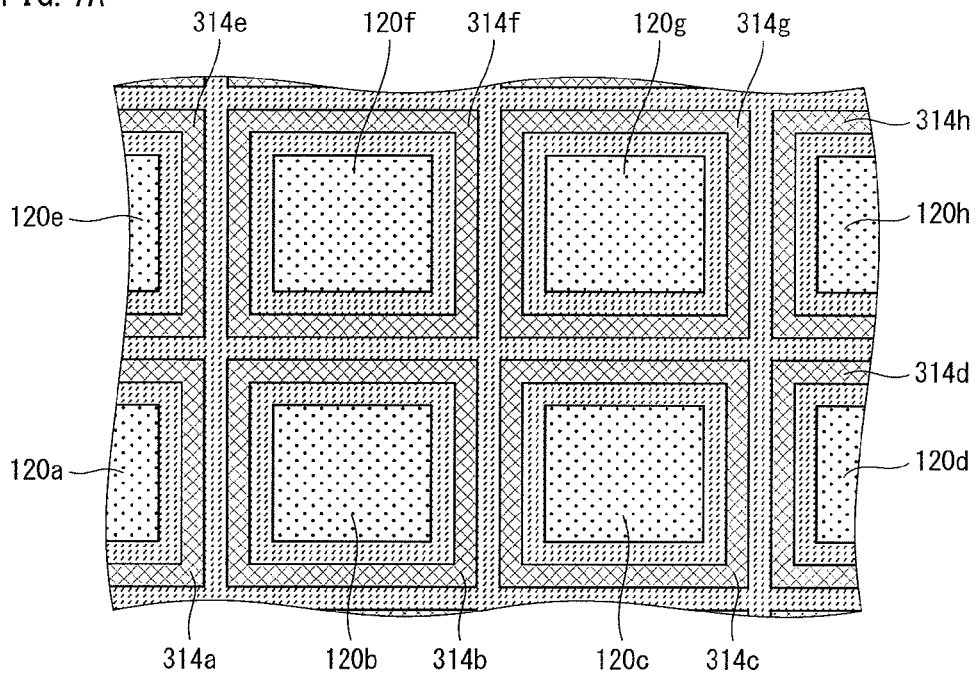
FIGS. 7A and 7B illustrate modifications pertaining to the layout of the grooves.
Figure 7B:
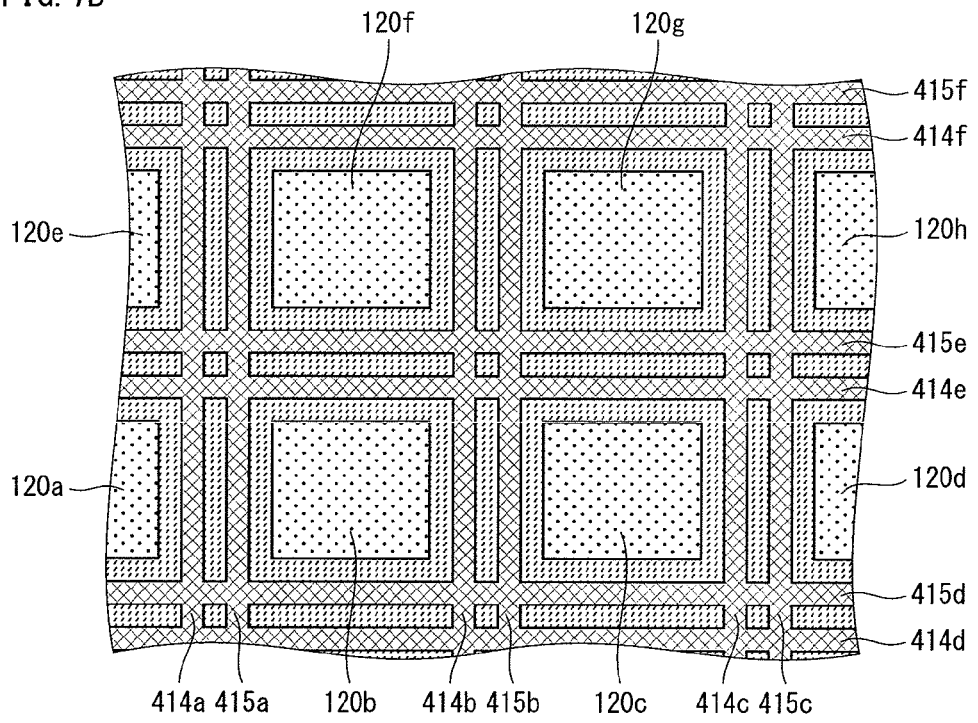

According to the above embodiment, one groove extending longitudinally is formed between any two adjacent multilayered light-emitting structures, and one groove extending laterally is formed between any two adjacent multilayered light-emitting structures. However, it is not limited to such as long as the grooves can surround the multilayered light-emitting structures individually. For example, as shown in FIG. 7A, annular grooves 314a, 314b, 314c, 314d, 314e, 314f, 314g, 314h, . . . may be formed such that each of the annular grooves surrounds a different one of the multilayered light-emitting structures. With this structure, the multilayered light-emitting structure 120b is surrounded by the annular groove 314b. Also, as shown in FIG. 7B, two grooves extending longitudinally may be formed between any two adjacent multilayered light-emitting structures, and two grooves extending laterally may be formed between any two adjacent multilayered light-emitting structures. According to this structure, the multilayered light-emitting structure 120b is surrounded by four grooves, i.e., grooves 415a and 414b extending longitudinally and grooves 415d and 414e extending laterally. The multilayered light-emitting structure 120c, located next to the multilayered light-emitting structure 120b, is also surrounded by four grooves, i.e., grooves 415b and 414c extending longitudinally, and the grooves 415d and 414e extending laterally.

(4) Modifications Pertaining to Depth of Each Groove

Figure 8A:
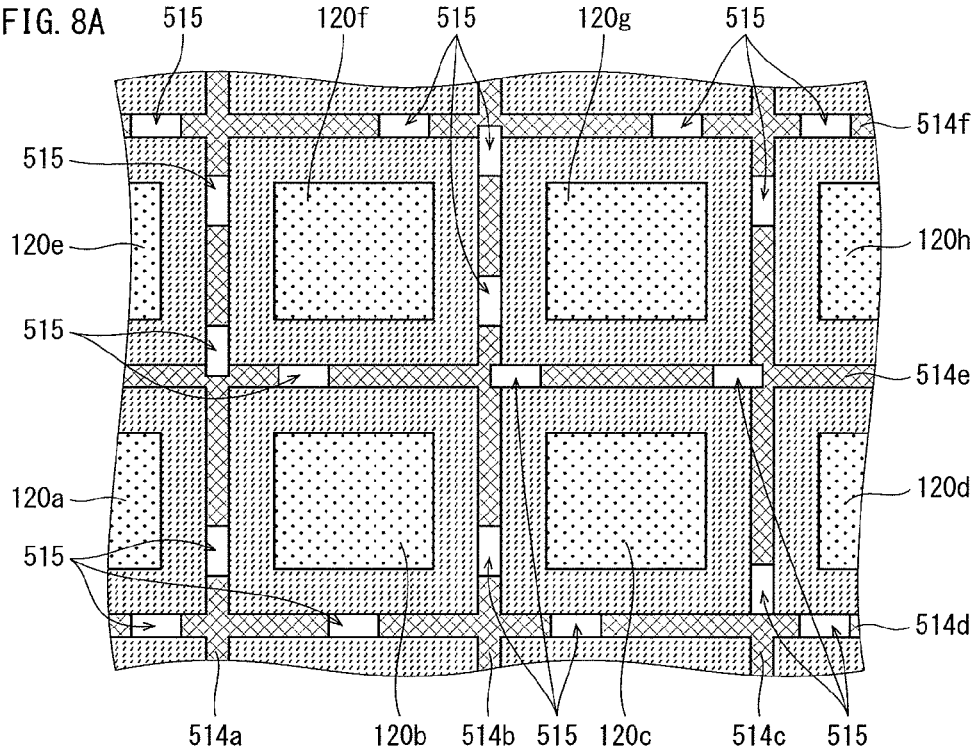
FIGS. 8A and 8B illustrate modifications pertaining to the depth of the grooves.
Figure 8B:
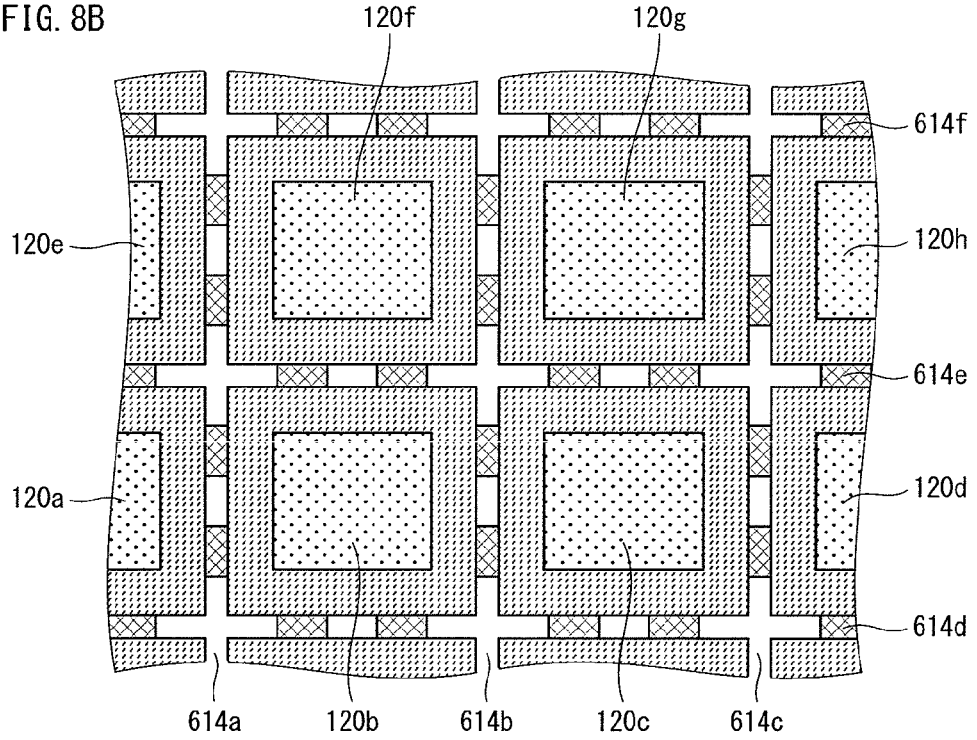

According to the above embodiment, the depth of each groove is substantially constant over the entirety of the groove. However, it is not limited to such as long as the large substrate can be handled as a whole. For example, the depth of each groove may partially vary, and part of each groove may penetrate through the substrate. In the example of FIG. 8A, through-holes 515 are formed in grooves 514a, 514b, 514c, 514d, 514e, and 514f. This is realized by, for example, forming the grooves with a perforation cutter. Also, in the example of FIG. 8B, the proportion of through-holes is relatively large in grooves 614a, 614b, 614c, 614d, 614e, and 614f.

In this way, although part of each groove penetrates through the large substrate, the substrate is not completely cut into multiple substrates. This allows for handling of the substrate as a whole; therefore, productivity is not lowered. Also, when part of each groove penetrates through the substrate, the distance of cutting at the time of cutting the substrate is correspondingly shortened. This reduces mechanical or thermal stress applied at the cut surfaces of the substrate.

(5) Modifications Pertaining to Cutting Position

According to the above embodiment, only one groove is formed between any two adjacent multilayered light-emitting structures. Therefore, one of the two inner side surfaces of a groove is adjacent to one multilayered light-emitting structure, and the other to another multilayered light-emitting structure. For example, in FIG. 4B, one of the two inner side surfaces 110b of the groove 114a is adjacent to the multilayered light-emitting structure 120a, and the other is adjacent to the multilayered light-emitting structure 120b. Accordingly, in order for parts of the sealing film covering the respective inner side surfaces of the groove to remain, it is desirable to cut the substrate along the groove at a position substantially at the center of the groove. However, as shown in FIGS. 9A-9D and 10A to 10D, when two grooves are formed between the multilayered light-emitting structures, it is not necessary to cut the substrate along each groove at a position substantially at the center of the groove.

Figure 9A:
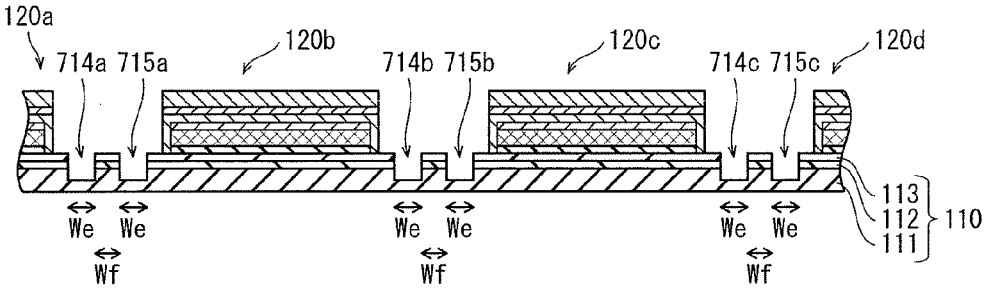
FIGS. 9A to 9D illustrate a modification pertaining to a cutting position.
Figure 9B:
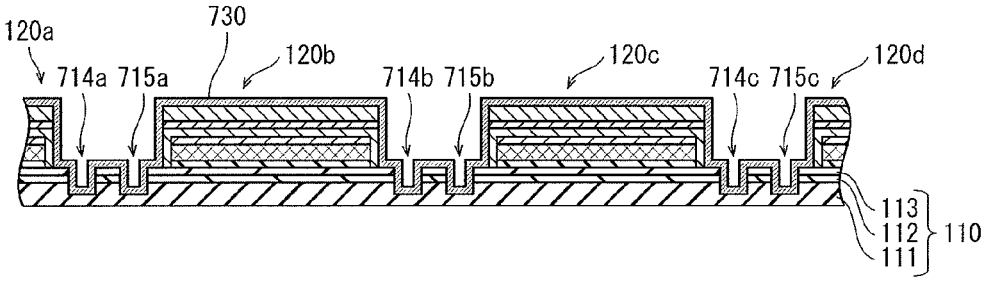
Figure 9C:
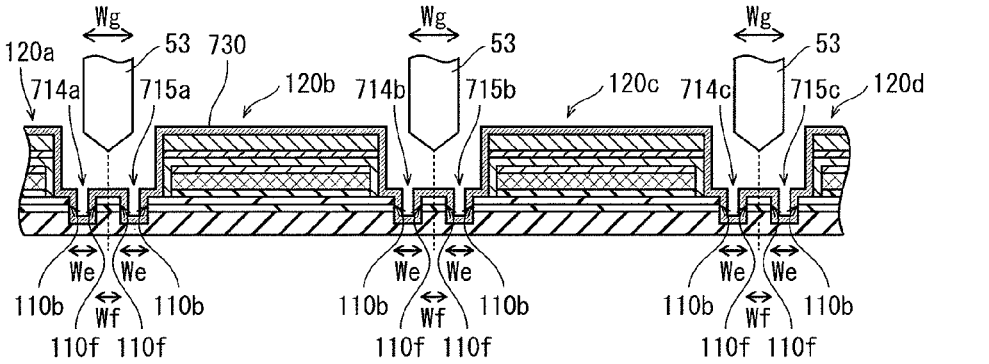
Figure 9D:
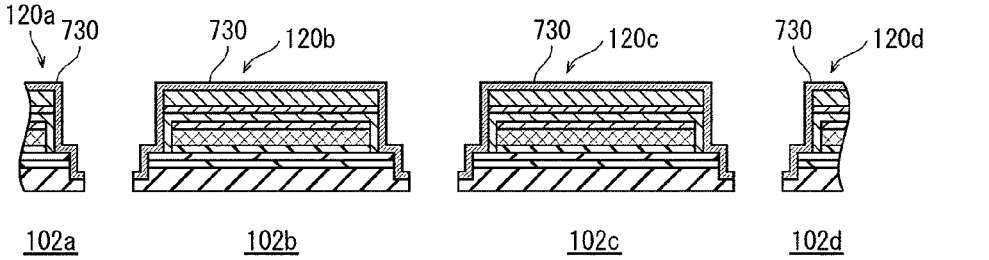

First, the multilayered light-emitting structures 120a, 120b, 120c, 120d, . . . are formed on the substrate 110, and a pair of grooves 714a and 715a, a pair of 714b and 715b, a pair of 714c and 715c, . . . are each formed between two adjacent multilayered light-emitting structures (FIG. 9A). Between any two adjacent multilayered light-emitting structures, two grooves having a width We are formed. The two grooves are spaced apart from each other by a width Wf. Next, a sealing film 730 is formed entirely over the substrate 110 (FIG. 9B). Then, cutters 53, each having a width Wg which satisfies $Wf<Wg<2We+Wf$, are prepared (FIG. 9C). With use of the cutters 53, the substrate 110 is cut between every two adjacent grooves (FIG. 9D).

Figure 10A:
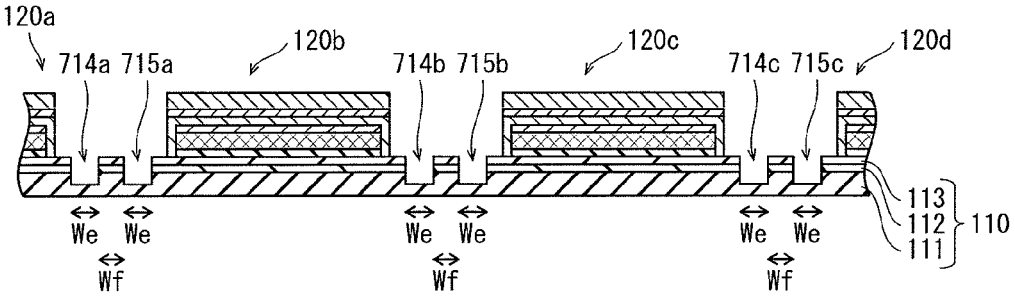
FIGS. 10A to 10D illustrate a modification pertaining to a cutting position.
Figure 10B:
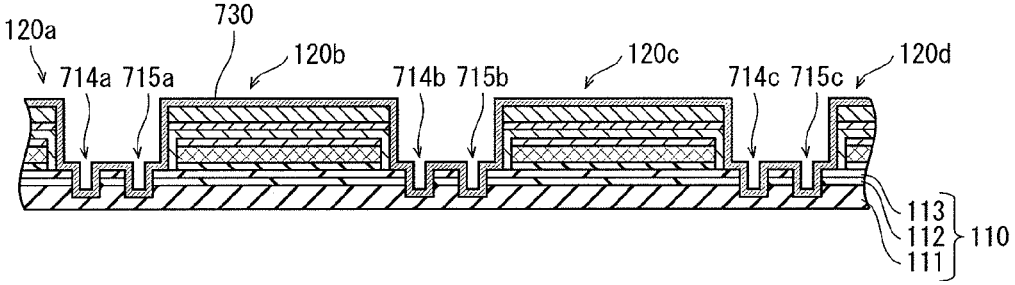
Figure 10C:
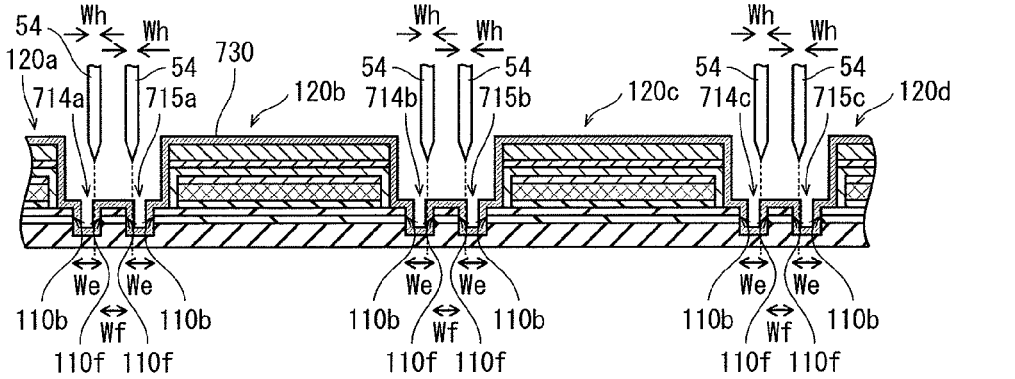
Figure 10D:
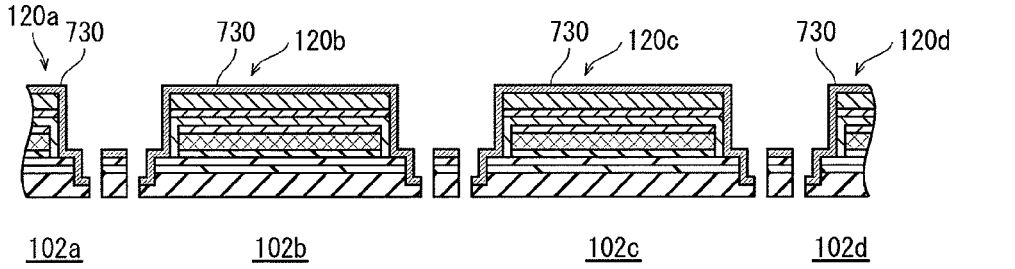

Alternatively, cutters 54, each having a width Wh smaller than a width We, are prepared (FIG. 10C). With use of the cutters 54, the substrate 110 is cut along each groove at a position away from substantially at the center of the groove.

In the examples of FIGS. 9A-9D and 10A to 10D, the inner side surface 110b of each groove is adjacent to any of the multilayered light-emitting structures. However, an inner side surface 110f of each groove is not adjacent to any of the multilayered light-emitting structures. Accordingly, although it is necessary that parts of the sealing film 730 that cover the inner side surfaces 110b remain, it is not necessary that the inner side surfaces 110f remain. In such a case, it is not necessary to cut the substrate along each groove at a position substantially at the center of the groove. Even without doing so, parts of the sealing film that cover the inner side surfaces adjacent to the multilayered light-emitting structures still remain.

(6) Modifications Pertaining to Cross-Sectional Shape of Grooves

According to the above embodiment, the cross-sectional shape of each groove is rectangular, and the top surface of the substrate and an inner side surface of each groove form substantially a right angle. However, it is not limited to such. For example, the cross-sectional shape of each groove may be V-shaped or inverted trapezoidal, so that the inner side surfaces of each groove are inclined. This enhances the coverage of the sealing film.

(7) Modifications Pertaining to Means of Cutting Grooves

According to the above embodiment, the grooves are cut with a cutter. However, it is not limited to such. For example, the grooves may be cut through a physical process such as a laser process, or a chemical process such as etching.

(8) Modifications Pertaining to Timing of Forming Grooves

Figure 11A:
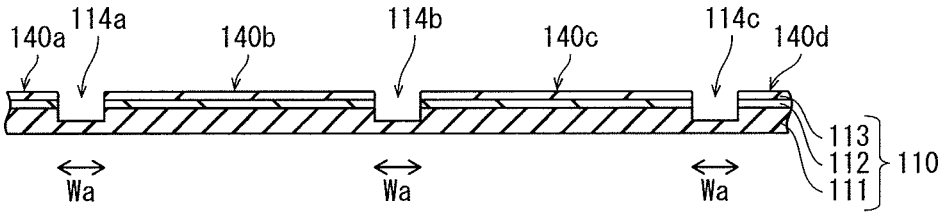
FIGS. 11A and 11B illustrate modifications pertaining to the formation of the grooves.
Figure 11B:
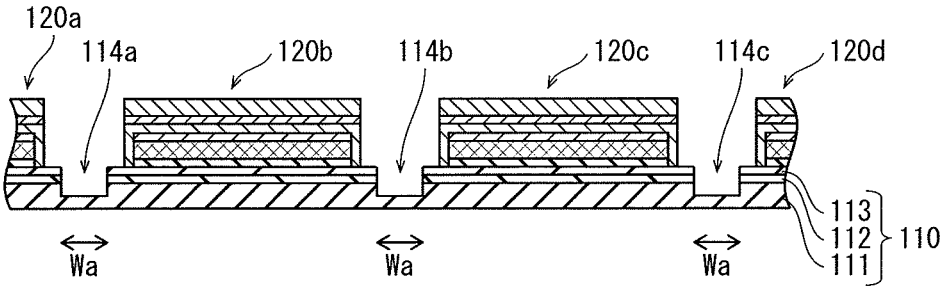

According to the above embodiment, the grooves are formed in the substrate after the multilayered light-emitting structures are formed on the substrate. However, it is not limited to such. The grooves may be formed in the substrate before the multilayered light-emitting structures are formed on the substrate. In this case, first, the grooves 114a, 114b, 114c, . . . are formed to individually surround regions 140a, 140b, 140c, 140d, . . . of the substrate 110 (FIG. 11A). The regions 140a, 140b, 140c, 140d, . . . are regions in which the multilayered light-emitting structures 120a, 120b, 120c, 120d, . . . are to be formed. Next, the multilayered light-emitting structures 120a, 120b, 120c, 120d, . . . are respectively formed in the regions 140a, 140b, 140c, 140d, . . . of the substrate 110 (FIG. 11B). Subsequent steps are the same as the above embodiment.

Alternatively, the grooves may be formed after part of each multilayered light-emitting structure is formed on the substrate. Thereafter, the remaining part of each multilayered light-emitting structure may be formed.

(9) Additional Sealing Structure

Figure 12:
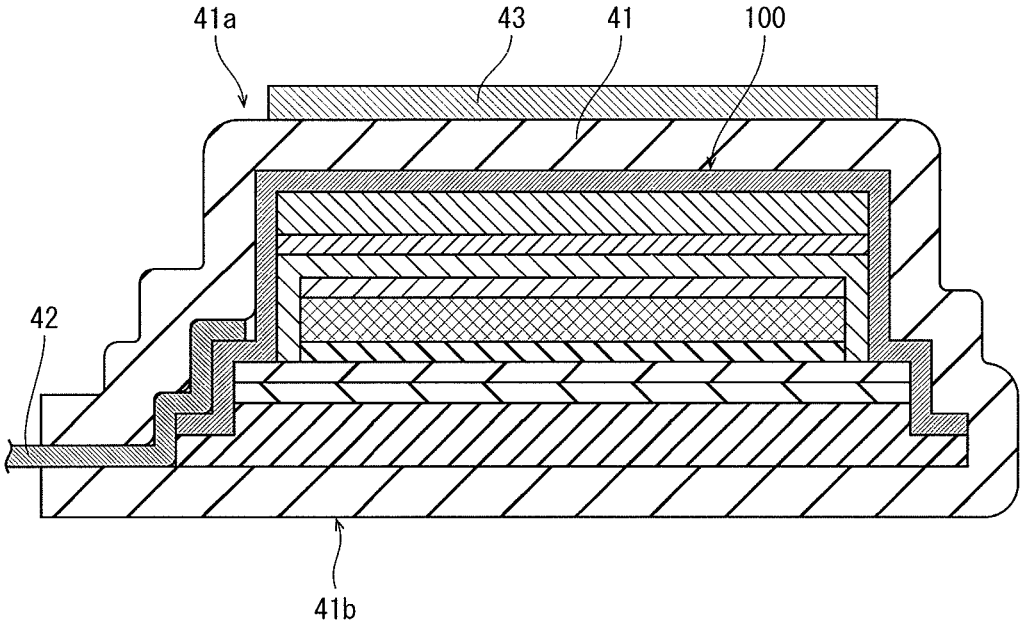
FIG. 12 illustrates an additional sealing structure.

According to the above embodiment, each multilayered light-emitting structure is sealed with the gas barrier layer 12 and the sealing film 30. However, the present disclosure may further include an additional sealing structure. For example, in the example of FIG. 12, the light-emitting device 100 is inserted inside a bag-shaped resin film 41 in which a gas barrier layer is formed. In this state, the bag-shaped resin film 41 is vacuum-compressed. The light-emitting device 100 is supplied with power via an outer lead 42. An electrode 43 for a touch panel is formed on a top surface 41a of the bag-shaped resin film 41. In a case where the light-emitting device 100 is a bottom emission type, the electrode 43 for a touch panel is formed on a bottom surface 41b of the bag-shaped film 41.

(10) Scope of Application

According to the above embodiment, the light-emitting device is an organic EL display. However, the light-emitting device is not necessarily an organic EL display and may be another light-emitting device as long as the device needs sealing. For example, the light-emitting device may be an organic EL lighting apparatus. Note that organic EL displays come in many types. For example, depending on the method for extracting light, there are a top emission type, a bottom emission type, a double-sided emission type, etc. Also, depending on the method for driving, there are an active matrix type, a passive matrix type, etc. The present disclosure is applicable to any type of organic EL display.

[Industrial Applicability]

The present disclosure is applicable to displays and lighting apparatuses, for example.

REFERENCE SIGNS LIST

10 substrate
10a top surface of substrate
10b outer side surface of substrate
10c top surface of extended portion
10d outer side surface
10e extended portion
11 resin film
12 gas barrier layer
13 TFT layer
16 glass substrate
20 multilayered light-emitting structure
21 anode layer
22 light-emitting layer
23 cathode layer
24 sealing layer
25 resin layer
26 resin film
30 sealing film
41 resin film
42 outer lead
43 electrode for touch panel
51, 52, 53, and 54 cutter
100 light-emitting device
110 substrate
120 multilayered light-emitting structure
221 bank
222a hole injection layer
223a hole transport layer
224a organic EL layer
225 electron transport layer
100a-100d light-emitting device
110b inner side surface of groove
110f inner side surface of groove
111 resin film
112 gas barrier layer
113 TFT layer
114a-114f groove
120a-120h multilayered light-emitting structure
121 anode layer
122 light-emitting layer
123 cathode layer
124 sealing layer
125 resin layer
126 resin film
130 sealing film
214a-214c groove
314a-314f groove
414a-414f groove
415a-415f groove
514a-514f groove
515 through-hole
614a-614f groove
714a-714c groove
715a-715c groove

The invention claimed is:

[1. A light-emitting device, comprising:

a substrate having a top surface, a bottom surface, and an outer side surface;

a multilayered light-emitting structure disposed over the top surface of the substrate, and including a first electrode, a light-emitting layer, and a second electrode; and a sealing film covering the multilayered light-emitting structure, wherein the substrate includes a gas barrier layer that opposes the sealing film via the multilayered light-emitting structure, and the outer side surface of the substrate includes a first region extending from the top surface of the substrate to the gas barrier layer, and a second region extending from the gas barrier layer to the bottom surface of the substrate, the first region being covered by the sealing film, and a part of the second region is covered by the sealing film while another part of the second region is not covered by the sealing film, wherein the gas barrier material is an electrical insulator.]

[2. The light-emitting device of claim 1, wherein the substrate further comprises:

a thin film transistor layer disposed above the gas barrier layer; and a resin film layer disposed below the gas barrier layer.]

[3. The light-emitting device of claim 2, wherein a portion of the resin film layer extends outwards from the outer side surface to be longer than at least one of the thin film transistor layer and the gas barrier layer in a direction of the extension.]

[4. The light-emitting device of claim 2, wherein the first electrode and the second electrode contact the thin film transistor layer.]

[5. The light-emitting device of claim 2, wherein the thin film transistor layer is a flat structure without protrusions or recesses.]

*6. A light-emitting device comprising:*

*a substrate;*

*a resin film on the substrate;*

*a gas barrier layer on the resin film;*

*a thin film transistor layer on the gas barrier layer;*

*a first electrode on the thin film transistor layer;*

*a light-emitting layer on the first electrode;*

*a second electrode on the light-emitting layer;*

*a first sealing film on the second electrode, the first sealing film comprising a first inorganic material;*

*a first resin layer on the first sealing film; and*

*a second sealing film on the first resin layer, the second sealing film comprising a second inorganic material,*

*wherein a first portion of the first sealing film overlays the second electrode and is separated from the second sealing film with the first resin layer interposed therebetween, and*

*wherein a second portion of the first sealing film is adjacent to the second sealing film without the first resin layer interposed therebetween, the second portion of the first sealing film being extended from the first portion of the first sealing film.*

*7. The light-emitting device of claim 6, wherein the gas barrier layer is an electrical insulator.*

*8. The light-emitting device of claim 7, wherein the gas barrier layer comprises a third inorganic material.*

*9. The light-emitting device of claim 8, wherein the first inorganic material and the third inorganic material is silicon nitride, and*

*wherein the second inorganic material is silicon nitride or aluminum oxide.*

*10. The light-emitting device of claim 6, wherein the second portion of the first sealing film contacts the second sealing film.*

*11. The light-emitting device of claim 6, wherein an end portion of the first sealing film is located closer to a multilayered structure than an end portion of the second sealing film, the multilayered structure comprising the first electrode, the light-emitting layer, and the second electrode.*

*12. The light-emitting device of claim 11, wherein a portion of the second sealing film is adjacent to the gas barrier layer without the first resin layer, the first sealing film, and the multilayered structure interposed therebetween, and*

*wherein the end portion of the first sealing film is located closer to the multilayered structure than the portion of the second sealing film.*

*13. The light-emitting device of claim 12, wherein the portion of the second sealing film contacts a portion of the gas barrier layer.*

*14. The light-emitting device of claim 11, wherein the second sealing film and the first sealing film are adjacent to the thin film transistor layer without the multilayered structure interposed therebetween.*

*15. The light-emitting device of claim 6, further comprising a touch panel sensor,*

*wherein an electrode of the touch panel sensor is over the second sealing film with a second resin layer interposed therebetween.*

* * * * *